US012792070B2

(12) United States Patent
Tzeng et al.

(10) Patent No.: US 12,792,070 B2
(45) Date of Patent: Nov. 10, 2026

(54) ACCURATE TEMPERATURE MONITOR

(71) Applicant: Taiwan Semiconductor Manufacturing Company, Ltd., Hsinchu (TW)

(72) Inventors: Chris Tzeng, Hsinchu (TW); Yi Ling Tseng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1012 days.

(21) Appl. No.: 17/866,533

(22) Filed: Jul. 17, 2022

(65) Prior Publication Data

US 2024/0019881 A1 Jan. 18, 2024

(51) Int. Cl.
*G05D 23/20* (2006.01)
*H10P 72/00* (2026.01)
*H10P 74/00* (2026.01)

(52) U.S. Cl.
CPC ......... *G05D 23/20* (2013.01); *H10P 72/0602* (2026.01); *H10P 74/238* (2026.01)

(58) Field of Classification Search
CPC ........................... G05D 23/24; G05D 23/2236
See application file for complete search history.

(56) References Cited

U.S. PATENT DOCUMENTS 5,519,296 A * 5/1996 Day ......................... B62D 1/28 318/587
2015/0083708 A1* 3/2015 Xiang .................. G01K 15/005 219/494

FOREIGN PATENT DOCUMENTS

CN 107037840 A * 8/2017 ............ H05B 45/37

OTHER PUBLICATIONS

CN 107037840 translation (Year: 2017).*

* cited by examiner

*Primary Examiner* — Woody A Lee, Jr.
(74) *Attorney, Agent, or Firm* — Kilpatrick Townsend & Stockton LLP

(57) ABSTRACT

A temperature control system is disclosed. The temperature control system includes a temperature monitor system. The temperature monitor system includes an anti-drift system having first and second amplification stages and first and second filter stages. At least one of the first amplification stage, the second amplification stage, the first filter stage, and the second filter stage has an active feedback circuit.

19 Claims, 11 Drawing Sheets

ACCURATE TEMPERATURE MONITOR

TECHNICAL FIELD

The subject matter described herein relates to a temperature control system, and more particularly to a highly accurate temperature control monitor and a temperature controls system using the temperature control monitor.

BACKGROUND

Semiconductor manufacturing processes include numerous fabrication steps or processes, each of which contributes to the formation of one or more semiconductor layers. Some layers are conductive and provide electrical connections between devices of an electronic system. Some layers may be formed, for example, by doping sections of a crystalline semiconductor substrate. In addition, one or more layers may be formed by adding, for example, conductive, resistive, and/or insulative layers on the crystalline semiconductor substrate. In certain formation processes controlling a temperature is important.

Semiconductor arrangements are used in a multitude of electronic devices, such as mobile phones, laptops, desktops, tablets, watches, gaming systems, and various other industrial, commercial, and consumer electronics. Semiconductor arrangements generally comprise semiconductor portions and wiring portions formed inside the semiconductor portions.

DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

When practical, similar reference numbers denote similar structures, features, or elements.

DETAILED DESCRIPTION

Figure 1:
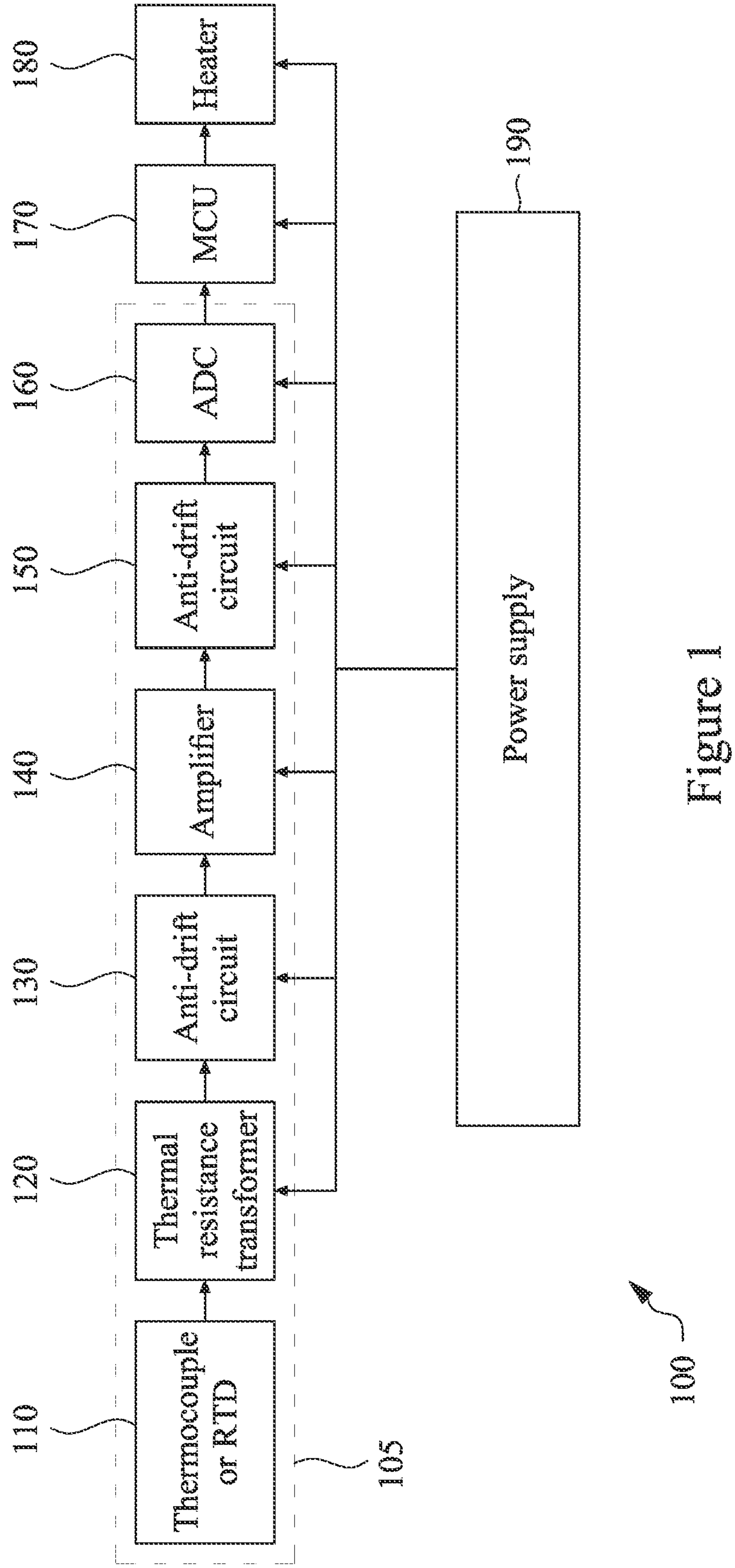
FIG. 1 illustrates a temperature control system according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Some processes used to form semiconductors are sensitive to environmental temperature. For example, wet etching processes apply a chemical etchant to a semiconductor substrate, where one or more structures are formed from a material sensitive to the chemical etchant. The chemical reaction between the sensitive material and the chemical etchant causes the sensitive material to be removed, where the amount of sensitive material removed, or the depth of the etch, is controlled by the rate of the chemical reaction and the time duration of exposure of the sensitive material to the chemical etchant. Some etching processes are used to etch to a particular depth, where the accuracy of the particular depth is advantageously controlled. Because the rate of the etching process, or etch rate, is sensitive to temperature, deviation in the actual temperature from that specified results in an etch depth which correspondingly varies from that targeted. Accordingly, if the deviation in the actual temperature from that specified is greater than a threshold, the depth of the etch will vary from that targeted by greater than a threshold limit, and the semiconductor device formed on the semiconductor substrate will not perform as specified in at least one of electrical performance, mechanical performance, and reliability performance.

Other semiconductor processes which have outcomes that are sensitive to temperature include diffusion processes, epitaxial growth processes, plasma etching processes, and deposition processes including chemical vapor deposition (CVD), low pressure CVD (LPCVD), plasma-enhanced CVD (PECVD), and atomic layer deposition (ALD), and other deposition processes.

The embodiments discussed below illustrate examples of temperature control systems and temperature monitoring systems which provide temperature accuracy and temperature stability for use in semiconductor manufacturing processes to form semiconductor devices having high quality and high reliability at least partly because of the accuracy of the temperature used for the semiconductor manufacturing processes.

FIG. 1 illustrates a temperature control system 100 according to some embodiments. Temperature control system 100 includes temperature monitor system 105, microcontroller unit (MCU) 170, heater 180, and power supply system 190.

Temperature monitor system 105 is configured to sense a temperature of a physical aspect of a semiconductor manufacturing process. For example, temperature monitor system 105 may be configured to sense a temperature of a chemical etchant. In addition, temperature monitor system 105 is configured to generate an electronic temperature signal which corresponds to and communicates a temperature value of the sensed temperature.

MCU 170 is configured to receive the temperature signal from the temperature monitor system 105 and to generate a temperature control signal based at least in part on the temperature signal received from the temperature monitor system 105. For example, MCU 170 may be programmed with a target temperature value for the temperature of the physical aspect of the semiconductor manufacturing process. For example, the MCU 170 may be programmed with a target value for the temperature of the chemical etchant, where the target temperature value is equal to 22.505 C. In addition, the MCU 170 may be programmed and/or configured to compare the temperature value of the chemical etchant as represented by the temperature signal from the temperature monitor system 105 with the programmed target temperature value. In response to a difference between the temperature value of the chemical etchant and the target temperature value, the MCU 170 may adjust and/or control the temperature control signal. For example, if the MCU 170 determines that the temperature value of the chemical etchant is greater than the target temperature value, the MCU 170 may adjust the temperature control signal to cause the temperature value of the chemical etchant to be reduced. Similarly, if the MCU 170 determines that the temperature value of the chemical etchant is less than the target temperature value, the MCU 170 may adjust the temperature control signal to cause the temperature value of the chemical etchant to be increased.

In some embodiments, an operator receives the temperature control signal from MCU 170, for example, as displayed on a monitor. In response to the temperature control signal the operator modifies a control setting for heater 180 to control the temperature of the physical aspect of the semiconductor manufacturing process according to the temperature control signal.

In some embodiments, heater 180 may be configured to receive the temperature control signal from the MCU 170, and to control the temperature of the physical aspect of the semiconductor manufacturing process according to the temperature control signal. For example, the heater 180 may be configured to increase or decrease the temperature of the chemical etchant in response to the temperature control signal received from the MCU 170.

In some embodiments, temperature control system 100 includes a cooling system (not shown) configured to receive the temperature control signal from the MCU 170 and/or to have a control setting operable by an operator, and to control the temperature of the physical aspect of the semiconductor manufacturing process according to the temperature control signal or the control setting. For example, the cooling system may be configured to increase or decrease the temperature of the chemical etchant in response to the control signal received from the MCU 170 or the control setting modified by the operator.

Power supply system 190 may include any power supply system known to those of skill in the art. For example, power supply system 190 may be switching power supply, as known to those of skill in the art. Advantages of switching power supplies include higher power efficiency, lighter weight, smaller size, and less heat generation. In some embodiments, power supply system 190 is a linear power supply system, as known to those of skill in the art. Advantages of linear power supplies include simpler structure and lower noise. In some embodiments of temperature control system 100, power supply system 190 includes a linear power supply configured to at least supply power to temperature monitor system 105 so that the temperature signal generated by temperature monitor system 105 has reduced noise.

In some embodiments, power supply system 190 is configured to supply power to temperature monitor system 105, and does not supply power to MCU 170. In some embodiments, power supply system 190 is configured to supply power to temperature monitor system 105, and does not supply power to heater 180. In some embodiments, power supply system 190 is configured to supply power to temperature monitor system 105, and does not supply power to either of MCU 170 and heater 180.

In embodiments of temperature control system 100 where power supply system 190 does not supply power to MCU 170, MCU 170 receives power from another power supply. The other power supply may, for example, be a switching power supply. In embodiments of temperature control system 100 where power supply system 190 does not supply power to heater 180, heater 180 receives power from another power supply. The other power supply may, for example, be a switching power supply.

Accordingly, in some embodiments, temperature monitor system 105 receives power from a first type of power supply system, and either or both of MCU 170 and heater 180 receive power from a second type of power supply system. For example, and some embodiments, the first type of power supply system is a linear power supply system, and the second type of power supply system is a switched power supply system.

In the illustrated embodiment, temperature monitor system 105 includes thermal sensor 110, thermal signal transformer 120, first anti-drift circuit 130, amplifier 140, second anti-drift circuit 150, and ADC 160, where thermal sensor 110 and thermal signal transformer 120 at least partly form a temperature sensor signal generator, and where first anti-drift circuit 130, amplifier 140, and second anti-drift circuit 150 at least partly form an anti-drift system.

In some embodiments, thermal sensor 110 includes a thermocouple. In some embodiments, thermal sensor 110 includes a resistance temperature detector (RTD). In some embodiments, thermal sensor 110 includes a PT100 resistance thermometer. In some embodiments, another type of temperature detecting device configured to exhibit an electrical or mechanical property which changes according to a sense to temperature. Other temperature detection devices, as known to those of skill in the art may be used.

Thermal signal transformer 120 is configured to interface with thermal sensor 110 and to generate a temperature sensor signal based on a temperature or sensed by thermal sensor 110. In some embodiments, thermal signal transformer 120 is electrically coupled with thermal sensor 110, where thermal signal transformer 120 and thermal sensor 110 cooperatively generate the temperature sensor signal. In some embodiments, thermal sensor 110 includes an RTD, and thermal signal transformer 120 comprises a thermal resistance transformer, where the RTD and the thermal resistance transformer are collectively configured to cooperatively generate the temperature sensor signal. In some embodiments, different types of thermal sensors and thermal signal transformers are used.

First anti-drift circuit 130 is configured to receive the temperature sensor signal from thermal signal transformer 120. First anti-drift circuit 130 is configured to generate a modified thermal signal based on the received temperature sensor signal. For example, first anti-drift circuit 130 may include a signal filter. In some embodiments, one or more aspects of the filter may be programmable, and may be controlled, for example by an input from MCU 170. For example, in some embodiments, at least one of a corner frequency, a center frequency, a bandwidth, a number of or frequency of one or more poles, and a number of or frequency of one or more zeros may be controlled by an input from MCU 170. In some embodiments, first anti-drift circuit 130 includes an amplifier. In some embodiments, one or more aspects of the amplifier may be programmable, and may be controlled, for example by an input from MCU 170. For example, in some embodiments, at least one of an open loop gain, a closed loop gain, a corner frequency, a center frequency, a bandwidth, a number of or frequency of one or more poles, and a number of or frequency of one or more zeros may be controlled by an input from MCU 170.

First anti-drift circuit 130 may include features similar or identical to any of anti-drift circuits 400, 500, 600, 700, 600, and 700, illustrated in FIGS. 4-9, discussed below in more detail.

Amplifier 140 is configured to receive the modified thermal signal from first anti-drift circuit 130. Amplifier 140 is configured to generate an amplified thermal signal based on the received modified thermal signal. For example, amplifier 140 may include an amplifier. In some embodiments, one or more aspects of the amplifier may be programmable, and may be controlled, for example by an input from MCU 170. For example, in some embodiments, at least one of an open loop gain, a closed loop gain, a corner frequency, a center frequency, a bandwidth, a number of or frequency of one or more poles, and a number of or frequency of one or more zeros may be controlled by an input from MCU 170. In some embodiments, amplifier 140 is omitted and the output of first anti-drift circuit 130 is connected to the input of second anti-drift circuit 150.

Second anti-drift circuit 150 is configured to receive the amplified thermal signal from Amplifier 140. Second anti-drift circuit 150 is configured to generate an anti-drift thermal signal based on the received amplified thermal signal. For example, second anti-drift circuit 150 may include a signal filter. In some embodiments, one or more aspects of the filter may be programmable, and may be controlled, for example by an input from MCU 170. For example, in some embodiments, at least one of a corner frequency, a center frequency, a bandwidth, a number of or frequency of one or more poles, and a number of or frequency of one or more zeros may be controlled by an input from MCU 170. In some embodiments, second anti-drift circuit 150 includes an amplifier. In some embodiments, one or more aspects of the amplifier may be programmable, and may be controlled, for example by an input from MCU 170. For example, in some embodiments, at least one of an open loop gain, a closed loop gain, a corner frequency, a center frequency, a bandwidth, a number of or frequency of one or more poles, and a number of or frequency of one or more zeros may be controlled by an input from MCU 170.

In some embodiments, second anti-drift circuit 150 has substantially the same architecture or topology as that of first anti-drift circuit 130. In some embodiments, the architecture or topology of second anti-drift circuit is different from that of the first anti-drift circuit 130.

ADC 160 is configured to receive the anti-drift thermal signal from second anti-drift circuit 150 and to generate a digital signal having a value corresponding with the analog anti-drift thermal signal. The digital signal constitutes a temperature signal communicating the value of the temperature sensed by thermal sensor 110. In some embodiments, the digital signal has 10 bits, 12 bits, 14 bits, 16 bits, 18 bits, 20 bits, 22 bits, 24 bits, 26 bits, 28 bits, 30 bits, or 32 bits.

Because of the amplification and the filtering of first anti-drift circuit 130, amplifier 140, and second anti-drift circuit 150, the digital signal generated by ADC 160 is an accurate representation of the value of the temperature sensed by thermal sensor 110. In some embodiments, the accuracy of the digital signal is greater than about 0.1 C, about 0.05 C, about 0.02 C, about C, about 0.005 C, about 0.002 C, about 0.001 C, about 0.0005 C, about 0.0002 C, and about C.

Figure 2:
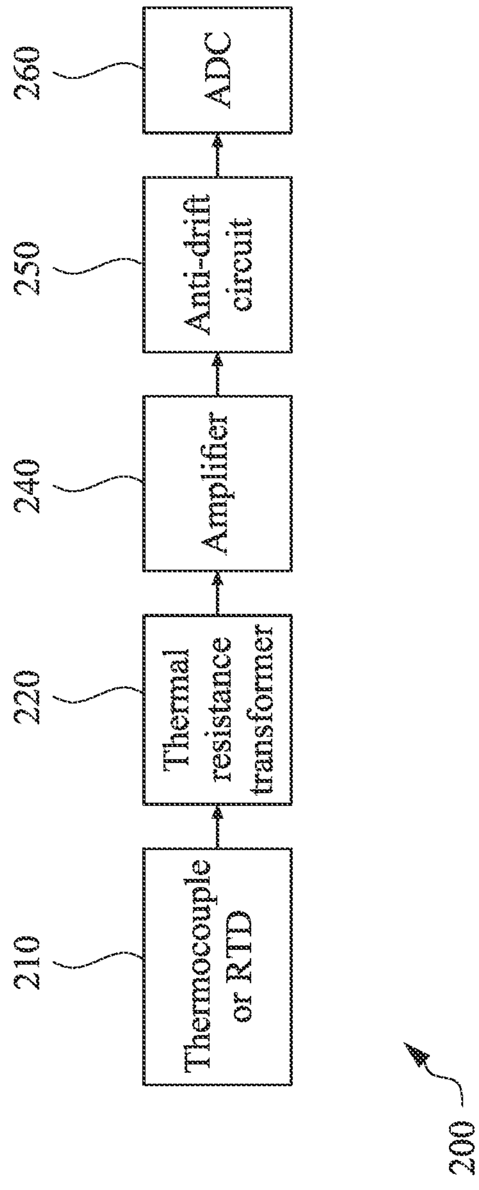
FIG. 2 illustrates a temperature monitor system according to some embodiments.

FIG. 2 illustrates a temperature monitor system 200 according to some embodiments. Temperature monitor system 200 may be used in, for example, temperature control system 100 in place of temperature monitor system 105. Temperature monitor system 200 is configured to sense a temperature of a physical aspect of a semiconductor manufacturing process. For example, temperature monitor system 200 may be configured to sense a temperature of a chemical etchant. In addition, temperature monitor system 200 is configured to generate an electronic temperature signal which corresponds to and communicates a temperature value of the sensed temperature. In some embodiments of temperature control system 100, other temperature monitor systems are used.

In the illustrated embodiment, temperature monitor system 200 includes thermal sensor 210, thermal signal transformer 220, amplifier 240, anti-drift circuit 250, and ADC 260, where thermal sensor 210 and thermal signal transformer 220 at least partly form a temperature sensor signal generator, and where amplifier 240 and anti-drift circuit 250 at least partly form an anti-drift system.

In some embodiments, thermal sensor 210 includes a thermocouple. In some embodiments, thermal sensor 210 includes a resistance temperature detector (RTD). In some embodiments, thermal sensor 210 includes a PT100 resistance thermometer. In some embodiments, another type of temperature detecting device configured to exhibit an electrical or mechanical property which changes according to a sense to temperature. Other temperature detection devices, as known to those of skill in the art may be used.

Thermal signal transformer 220 is configured to interface with thermal sensor 210 and to generate a temperature sensor signal based on a temperature or sensed by thermal sensor 210. In some embodiments, thermal signal transformer 220 is electrically coupled with thermal sensor 210, where thermal signal transformer 220 and thermal sensor 210 cooperatively generate the temperature sensor signal. In some embodiments, thermal sensor 210 includes an RTD, and thermal signal transformer 220 comprises a thermal resistance transformer, where the RTD and the thermal resistance transformer are collectively configured to cooperatively generate the temperature sensor signal. In some embodiments, different types of thermal sensors and thermal signal transformers are used.

Amplifier 240 is configured to receive the temperature sensor signal from thermal signal transformer 220. Amplifier 240 is configured to generate an amplified thermal signal based on the received temperature sensor signal. For example, amplifier 240 may include an amplifier. In some embodiments, one or more aspects of the amplifier may be programmable, and may be controlled, for example by an input from MCU 270. For example, in some embodiments, at least one of an open loop gain, a closed loop gain, a corner frequency, a center frequency, a bandwidth, a number of or frequency of one or more poles, and a number of or frequency of one or more zeros may be controlled by an input from MCU 270. In some embodiments, amplifier 240 is omitted and the output of thermal signal transformer 220 is connected to the input of anti-drift circuit 250.

Anti-drift circuit 250 is configured to receive the amplified thermal signal from amplifier 240. Anti-drift circuit 250 is configured to generate an anti-drift thermal signal based on the received amplified thermal signal. For example, anti-drift circuit 250 may include a signal filter. In some embodiments, one or more aspects of the filter may be programmable, and may be controlled, for example by an input from MCU 270. For example, in some embodiments, at least one of a corner frequency, a center frequency, a bandwidth, a number of or frequency of one or more poles, and a number of or frequency of one or more zeros may be controlled by an input from MCU 270. In some embodiments, anti-drift circuit 250 includes an amplifier. In some embodiments, one or more aspects of the amplifier may be programmable, and may be controlled, for example by an input from MCU 270. For example, in some embodiments, at least one of an open loop gain, a closed loop gain, a corner frequency, a center frequency, a bandwidth, a number of or frequency of one or more poles, and a number of or frequency of one or more zeros may be controlled by an input from MCU 270.

ADC 260 is configured to receive the anti-drift thermal signal from anti-drift circuit 250 and to generate a digital signal having a value corresponding with the analog anti-drift thermal signal. The digital signal constitutes a temperature signal communicating the value of the temperature sensed by thermal sensor 210. In some embodiments, the digital signal has 10 bits, 12 bits, 14 bits, 16 bits, 18 bits, 20 bits, 22 bits, 24 bits, 26 bits, 28 bits, 30 bits, or 32 bits.

Because of the amplification and the filtering of amplifier 240 and anti-drift circuit 250, the digital signal generated by ADC 260 is an accurate representation of the value of the temperature sensed by thermal sensor 210. In some embodiments, the accuracy of the digital signal is greater than about 0.1 C, about 0.05 C, about 0.02 C, about 0.01 C, about 0.005 C, about 0.002 C, about 0.001 C, about 0.0005 C, about 0.0002 C, and about 0.0001 C.

Figure 3:
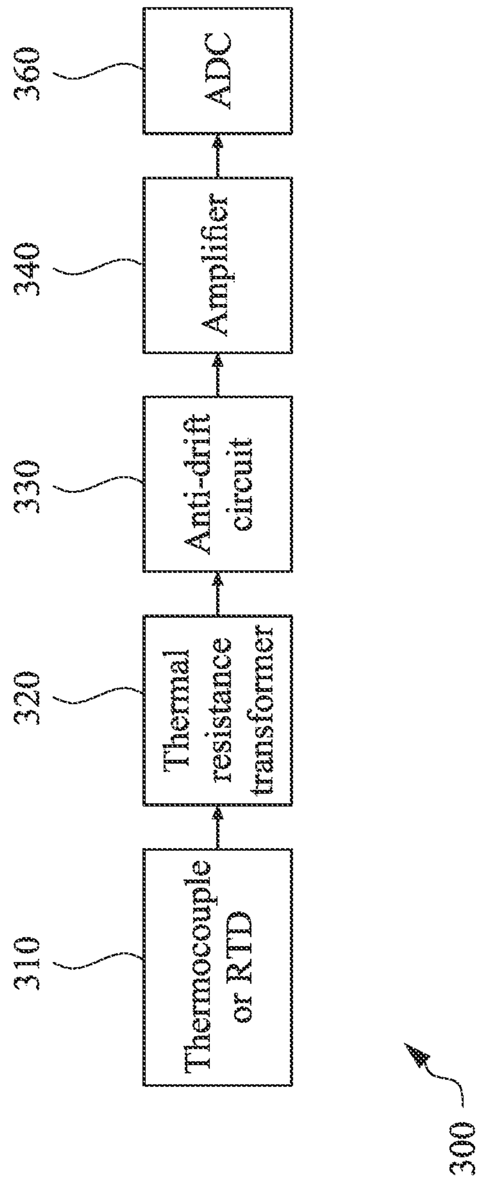
FIG. 3 illustrates a temperature monitor system according to some embodiments.

FIG. 3 illustrates a temperature monitor system 300 according to some embodiments. Temperature monitor system 300 may be used in, for example, temperature control system 100 in place of temperature monitor system 105. Temperature monitor system 300 is configured to sense a temperature of a physical aspect of a semiconductor manufacturing process. For example, temperature monitor system 300 may be configured to sense a temperature of a chemical etchant. In addition, temperature monitor system 300 is configured to generate an electronic temperature signal which corresponds to and communicates a temperature value of the sensed temperature. In some embodiments of temperature control system 100, other temperature monitor systems are used.

In the illustrated embodiment, temperature monitor system 300 includes thermal sensor 310, thermal signal transformer 320, anti-drift circuit 330, amplifier 340, and ADC 360, where thermal sensor 310 and thermal signal transformer 320 at least partly form a temperature sensor signal generator, and where anti-drift circuit 330 and amplifier 340 at least partly form an anti-drift system.

In some embodiments, thermal sensor 310 includes a thermocouple. In some embodiments, thermal sensor 310 includes a resistance temperature detector (RTD). In some embodiments, thermal sensor 310 includes a PT100 resistance thermometer. In some embodiments, another type of temperature detecting device configured to exhibit an electrical or mechanical property which changes according to a sense to temperature. Other temperature detection devices, as known to those of skill in the art may be used.

Thermal signal transformer 320 is configured to interface with thermal sensor 310 and to generate a temperature sensor signal based on a temperature or sensed by thermal sensor 310. In some embodiments, thermal signal transformer 320 is electrically coupled with thermal sensor 310, where thermal signal transformer 320 and thermal sensor 310 cooperatively generate the temperature sensor signal. In some embodiments, thermal sensor 310 includes an RTD, and thermal signal transformer 320 comprises a thermal resistance transformer, where the RTD and the thermal resistance transformer are collectively configured to cooperatively generate the temperature sensor signal. In some embodiments, different types of thermal sensors and thermal signal transformers are used.

Anti-drift circuit 330 is configured to receive the temperature sensor signal from thermal signal transformer 320. Anti-drift circuit 330 is configured to generate a modified thermal signal based on the received temperature sensor signal. For example, anti-drift circuit 330 may include a signal filter. In some embodiments, one or more aspects of the filter may be programmable, and may be controlled, for example by an input from MCU 370. For example, in some embodiments, at least one of a corner frequency, a center frequency, a bandwidth, a number of or frequency of one or more poles, and a number of or frequency of one or more zeros may be controlled by an input from MCU 370. In some embodiments, anti-drift circuit 330 includes an amplifier. In some embodiments, one or more aspects of the amplifier may be programmable, and may be controlled, for example by an input from MCU 370. For example, in some embodiments, at least one of an open loop gain, a closed loop gain, a corner frequency, a center frequency, a bandwidth, a number of or frequency of one or more poles, and a number of or frequency of one or more zeros may be controlled by an input from MCU 370.

Anti-drift circuit 330 may include features similar or identical to any of anti-drift circuits 400, 500, 600, 700, 600, and 700, illustrated in FIGS. 4-9, discussed below in more detail.

Amplifier 340 is configured to receive the modified thermal signal from anti-drift circuit 330. Amplifier 340 is configured to generate an amplified thermal signal based on the received modified thermal signal. For example, amplifier 340 may include an amplifier. In some embodiments, one or more aspects of the amplifier may be programmable, and may be controlled, for example by an input from MCU 370. For example, in some embodiments, at least one of an open loop gain, a closed loop gain, a corner frequency, a center frequency, a bandwidth, a number of or frequency of one or more poles, and a number of or frequency of one or more zeros may be controlled by an input from MCU 370. In some embodiments, amplifier 340 is omitted and the output of anti-drift circuit 330 is connected to the input of ADC 360.

ADC 360 is configured to receive the amplified thermal signal from second anti-drift circuit 350 and to generate a digital signal having a value corresponding with the analog anti-drift thermal signal. The digital signal constitutes a temperature signal communicating the value of the temperature sensed by thermal sensor 310. In some embodiments, the digital signal has 10 bits, 12 bits, 14 bits, 16 bits, 18 bits, 20 bits, 22 bits, 24 bits, 26 bits, 28 bits, 30 bits, or 32 bits.

Because of the amplification and the filtering of anti-drift circuit 330 and amplifier 340, the digital signal generated by ADC 360 is an accurate representation of the value of the temperature sensed by thermal sensor 310. In some embodiments, the accuracy of the digital signal is greater than about 0.1 C, about 0.05 C, about 0.02 C, about 0.01 C, about 0.005 C, about 0.002 C, about 0.001 C, about 0.0005 C, about 0.0002 C, and about 0.0001 C.

Figure 4:
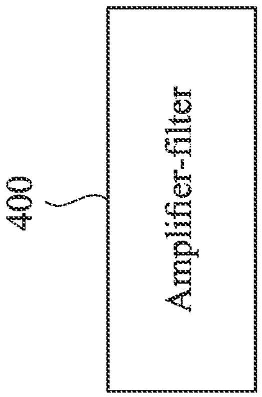
FIGS. 4-9 illustrate anti-drift circuits according to some embodiments.

FIG. 4 illustrates an anti-drift circuit 400 according to some embodiments.

Anti-drift circuit 400 is configured to receive an input signal and to generate an output signal based on the received input signal. For example, anti-drift circuit 400 may include a signal filter circuit. In some embodiments, one or more aspects of the filter circuit of anti-drift circuit 400 may be programmable, and may be controlled, for example by an input from MCU 170. For example, in some embodiments, at least one of a corner frequency, a center frequency, a bandwidth, a number of or frequency of one or more poles, and a number of or frequency of one or more zeros of the signal filter may be controlled by an input from a controller, such as MCU 170. In some embodiments, anti-drift circuit 400 does not include a signal filter circuit. In some embodiments, anti-drift circuit 400 includes an amplifier circuit. In some embodiments, one or more aspects of the amplifier circuit of anti-drift circuit 400 may be programmable, and may be controlled, for example by an input from a controller, such as MCU 170. For example, in some embodiments, at least one of an open loop gain, a closed loop gain, a corner frequency, a center frequency, a bandwidth, a number of or frequency of one or more poles, and a number of or frequency of one or more zeros of the amplifier circuit may be controlled by an input from the controller. In some embodiments, anti-drift circuit 400 does not include an amplifier circuit.

Figure 5:
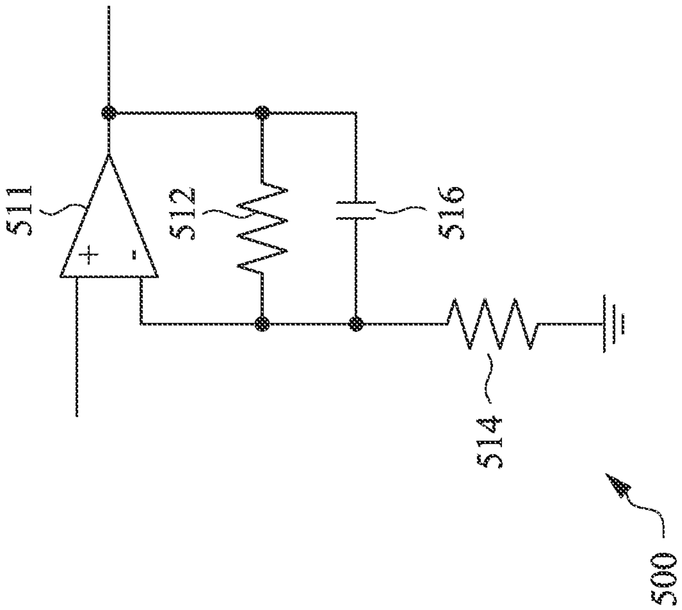

FIG. 5 illustrates an anti-drift circuit 500 according to some embodiments.

Anti-drift circuit 500 is configured to receive an input signal and to generate an output signal based on the received input signal. Anti-drift circuit 500 includes operational amplifier circuit 511, feedback resistor 512, feedback capacitor 516, and input resistor 514. Other anti-drift circuits may be used.

An input signal is received at the noninverting input of operational amplifier circuit 511. Input resistor 514 is connected to a ground and to the inverting input of operational amplifier circuit 511. Feedback resistor 512 is connected between the inverting input of operational amplifier circuit 511 and the output of operational amplifier circuit 511. Feedback capacitor 516 is connected between the inverting input of operational amplifier circuit 511 and the output of operational amplifier circuit 511.

In this embodiment, anti-drift circuit 500 includes a signal filter circuit having signal filtering characteristics related to the capacitance value of feedback capacitor 516, the resistance value of feedback resistor 512, and the resistance value of input resistor 514, as understood by those of skill in the art.

In this embodiment, anti-drift circuit 500 includes an amplifier circuit having DC signal amplification characteristics related to the resistance value of feedback resistor 512, and the resistance value of input resistor 514, as understood by those of skill in the art.

Anti-drift circuit 500 operates according to principles understood by those of skill in the art based on the circuit diagram representation of FIG. 5.

Figure 6:
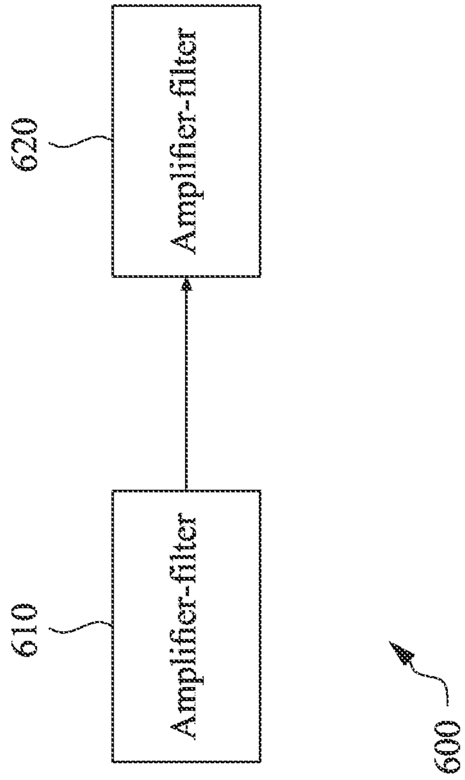

FIG. 6 illustrates an anti-drift circuit 600 according to some embodiments. Anti-drift circuit 600 includes first amplifier-filter circuit 610 and second amplifier-filter circuit 620.

First amplifier-filter circuit 610 is configured to receive an input signal and to generate an output signal based on the received input signal. For example, first amplifier-filter circuit 610 may include a signal filter circuit. In some embodiments, one or more aspects of the filter circuit of first amplifier-filter circuit 610 may be programmable, and may be controlled, for example by an input from MCU 170. For example, in some embodiments, at least one of a corner frequency, a center frequency, a bandwidth, a number of or frequency of one or more poles, and a number of or frequency of one or more zeros of the signal filter may be controlled by an input from a controller, such as MCU 170. In some embodiments, first amplifier-filter circuit 610 does not include a signal filter circuit. In some embodiments, first amplifier-filter circuit 610 includes an amplifier circuit. In some embodiments, one or more aspects of the amplifier circuit of first amplifier-filter circuit 610 may be programmable, and may be controlled, for example by an input from a controller, such as MCU 170. For example, in some embodiments, at least one of an open loop gain, a closed loop gain, a corner frequency, a center frequency, a bandwidth, a number of or frequency of one or more poles, and a number of or frequency of one or more zeros of the amplifier circuit may be controlled by an input from the controller. In some embodiments, first amplifier-filter circuit 610 does not include an amplifier circuit.

Second amplifier-filter circuit 620 is configured to receive an input signal and to generate an output signal based on the received input signal. For example, second amplifier-filter circuit 620 may include a signal filter circuit. In some embodiments, one or more aspects of the filter circuit of second amplifier-filter circuit 620 may be programmable, and may be controlled, for example by an input from MCU 170. For example, in some embodiments, at least one of a corner frequency, a center frequency, a bandwidth, a number of or frequency of one or more poles, and a number of or frequency of one or more zeros of the signal filter may be controlled by an input from a controller, such as MCU 170. In some embodiments, second amplifier-filter circuit 620 does not include a signal filter circuit. In some embodiments, second amplifier-filter circuit 620 includes an amplifier circuit. In some embodiments, one or more aspects of the amplifier circuit of second amplifier-filter circuit 620 may be programmable, and may be controlled, for example by an input from a controller, such as MCU 170. For example, in some embodiments, at least one of an open loop gain, a closed loop gain, a corner frequency, a center frequency, a bandwidth, a number of or frequency of one or more poles, and a number of or frequency of one or more zeros of the amplifier circuit may be controlled by an input from the controller. In some embodiments, second amplifier-filter circuit 620 does not include an amplifier circuit.

Figure 7:
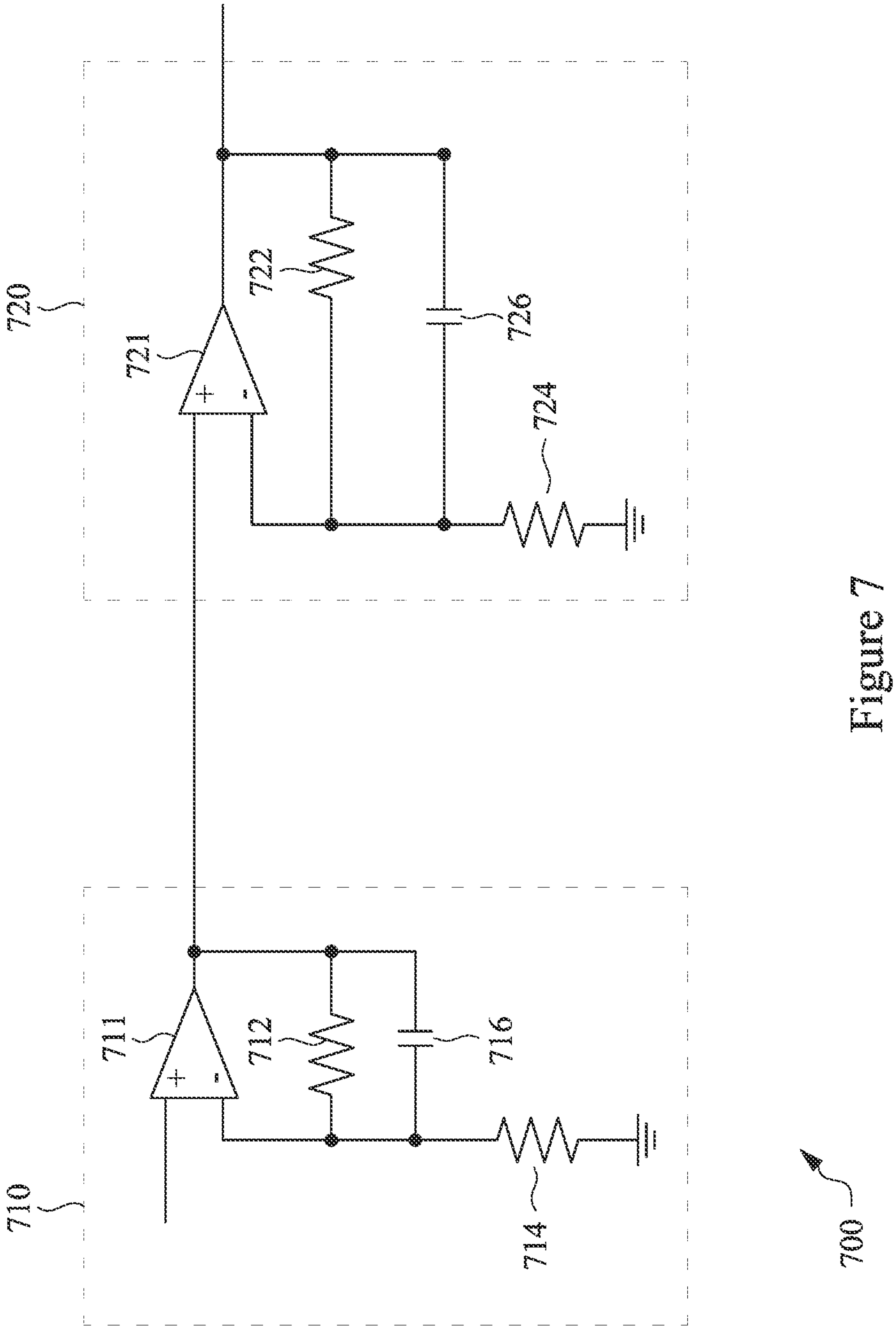

FIG. 7 illustrates an anti-drift circuit 700 according to some embodiments. Anti-drift circuit 700 includes first amplifier-filter circuit 710 and second amplifier-filter circuit 720.

First amplifier-filter circuit 710 is configured to receive an input signal and to generate an output signal based on the received input signal. First amplifier-filter circuit 710 includes operational amplifier circuit 711, feedback resistor 712, feedback capacitor 716, and input resistor 714. Other first amplifier-filter circuits may be used.

An input signal is received at the noninverting input of operational amplifier circuit 711. Input resistor 714 is connected to a ground and to the inverting input of operational amplifier circuit 711. Feedback resistor 712 is connected between the inverting input of operational amplifier circuit 711 and the output of operational amplifier circuit 711.

In this embodiment, first amplifier-filter circuit 710 includes a signal filter circuit having signal filtering characteristics related to the capacitance value of feedback capacitor 716, the resistance value of feedback resistor 712, and the resistance value of input resistor 714, as understood by those of skill in the art.

In this embodiment, first amplifier-filter circuit 710 includes an amplifier circuit having DC signal amplification characteristics related to the resistance value of feedback resistor 712, and the resistance value of input resistor 714, as understood by those of skill in the art.

Second amplifier-filter circuit 720 is configured to receive an input signal from the first amplifier-filter circuit 710 and to generate an output signal based on the received input signal. Second amplifier-filter circuit 720 includes operational amplifier circuit 721, variable feedback resistor 722, feedback capacitor 726, and input resistor 724. Other first amplifier-filter circuits may be used.

The input signal is received from first amplifier-filter circuit 710 at the noninverting input of operational amplifier circuit 721. Input resistor 724 is connected to a ground and to the inverting input of operational amplifier circuit 721. Variable feedback resistor 722 is connected between the inverting input of operational amplifier circuit 721 and the output of operational amplifier circuit 721.

In this embodiment, second amplifier-filter circuit 720 includes a signal filter circuit having signal filtering characteristics related to the capacitance value of feedback capacitor 726, the resistance value of variable feedback resistor 722, and the resistance value of input resistor 724, as understood by those of skill in the art.

In this embodiment, second amplifier-filter circuit 720 includes an amplifier circuit having DC signal amplification characteristics related to the resistance value of variable feedback resistor 722, and the resistance value of input resistor 724, as understood by those of skill in the art.

In this embodiment, the resistance value of variable feedback resistor 722 is programmable, and may be controlled, for example by an input from a controller, such as MCU 170. Accordingly, the DC signal amplification characteristics and the signal filtering characteristics of second amplifier-filter circuit 720 may be controlled by an input from, for example, the controller.

Anti-drift circuit 700 operates according to principles understood by those of skill in the art based on the circuit diagram representation of FIG. 7.

Figure 8:
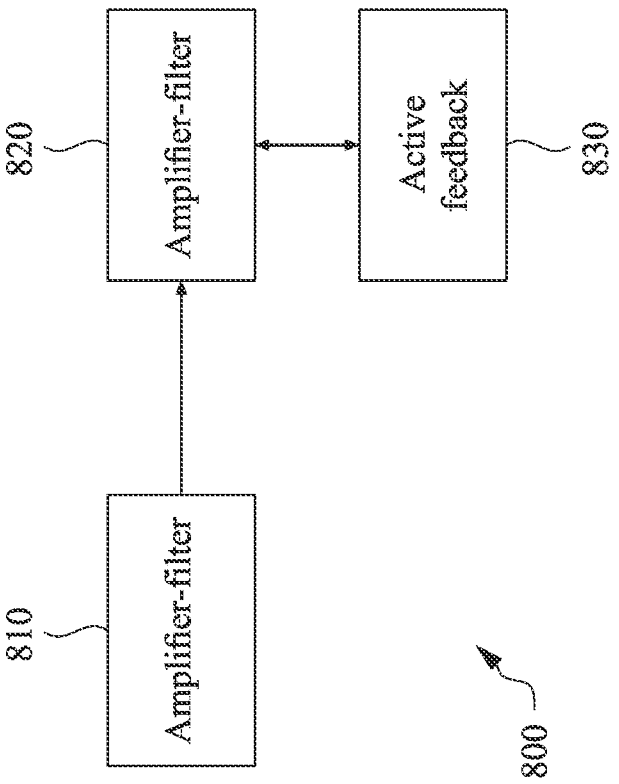

FIG. 8 illustrates an anti-drift circuit 800 according to some embodiments. Anti-drift circuit 800 includes first amplifier-filter circuit 810, second amplifier-filter circuit 820, and active feedback circuit 830.

First amplifier-filter circuit 810 is configured to receive an input signal and to generate an output signal based on the received input signal. For example, first amplifier-filter circuit 810 may include a signal filter circuit. In some embodiments, one or more aspects of the filter circuit of first amplifier-filter circuit 810 may be programmable, and may be controlled, for example by an input from MCU 170. For example, in some embodiments, at least one of a corner frequency, a center frequency, a bandwidth, a number of or frequency of one or more poles, and a number of or frequency of one or more zeros of the signal filter may be controlled by an input from a controller, such as MCU 170. In some embodiments, first amplifier-filter circuit 810 does not include a signal filter circuit. In some embodiments, first amplifier-filter circuit 810 includes an amplifier circuit. In some embodiments, one or more aspects of the amplifier circuit of first amplifier-filter circuit 810 may be programmable, and may be controlled, for example by an input from a controller, such as MCU 170. For example, in some embodiments, at least one of an open loop gain, a closed loop gain, a corner frequency, a center frequency, a bandwidth, a number of or frequency of one or more poles, and a number of or frequency of one or more zeros of the amplifier circuit may be controlled by an input from the controller. In some embodiments, first amplifier-filter circuit 810 does not include an amplifier circuit.

Second amplifier-filter circuit 820 is configured to receive an input signal and to generate an output signal based on the received input signal. For example, second amplifier-filter circuit 820 may include a signal filter circuit. In some embodiments, one or more aspects of the filter circuit of second amplifier-filter circuit 820 may be programmable, and may be controlled, for example by an input from MCU 170. For example, in some embodiments, at least one of a corner frequency, a center frequency, a bandwidth, a number of or frequency of one or more poles, and a number of or frequency of one or more zeros of the signal filter may be controlled by an input from a controller, such as MCU 170. In some embodiments, second amplifier-filter circuit 820 does not include a signal filter circuit. In some embodiments, second amplifier-filter circuit 820 includes an amplifier circuit. In some embodiments, one or more aspects of the amplifier circuit of second amplifier-filter circuit 820 may be programmable, and may be controlled, for example by an input from a controller, such as MCU 170. For example, in some embodiments, at least one of an open loop gain, a closed loop gain, a corner frequency, a center frequency, a bandwidth, a number of or frequency of one or more poles, and a number of or frequency of one or more zeros of the amplifier circuit may be controlled by an input from the controller. In some embodiments, second amplifier-filter circuit 820 does not include an amplifier circuit.

Active feedback circuit 830 may provide an additional feedback path in the closed loop of second amplifier-filter circuit 820. For example, active feedback circuit 830 may include an operational amplifier in a closed loop circuit configuration received an output signal from second amplifier-filter circuit 820 and to generate a feedback signal which is provided to an input of second amplifier-filter circuit 820.

In some embodiments, the active feedback circuit 830 includes an operational amplifier in an integrator configuration.

Figure 9:
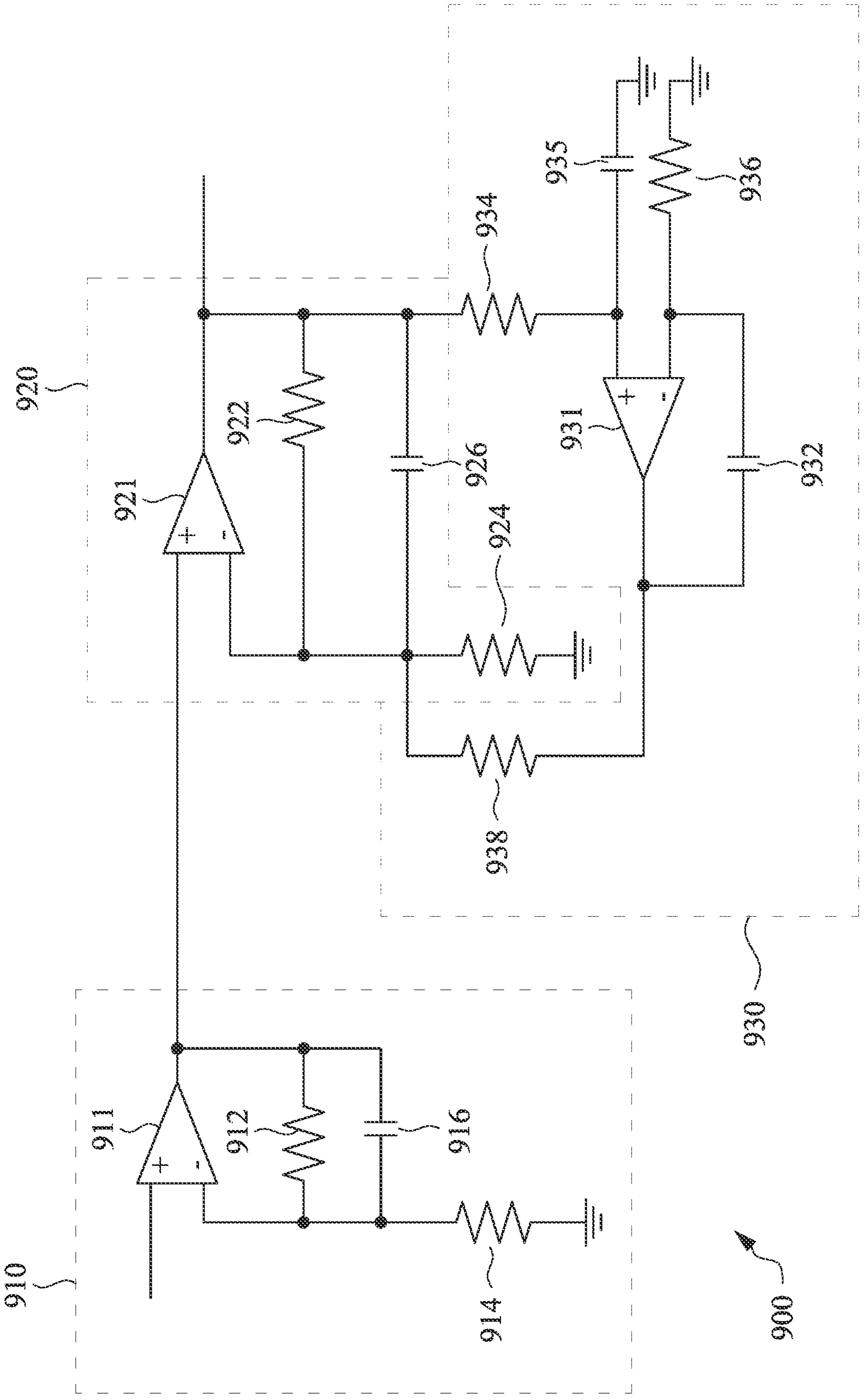

FIG. 9 illustrates an anti-drift circuit 900 according to some embodiments. Anti-drift circuit 900 includes first amplifier-filter circuit 910, second amplifier-filter circuit 920, and active feedback circuit 930.

First amplifier-filter circuit 910 is configured to receive an input signal and to generate an output signal based on the received input signal. First amplifier-filter circuit 910 includes operational amplifier circuit 911, feedback resistor 912, feedback capacitor 916, and input resistor 914. Other first amplifier-filter circuits may be used.

An input signal is received at the noninverting input of operational amplifier circuit 911. Input resistor 914 is connected to a ground and to the inverting input of operational amplifier circuit 911. Feedback resistor 912 is connected between the inverting input of operational amplifier circuit 911 and the output of operational amplifier circuit 911.

In this embodiment, first amplifier-filter circuit 910 includes a signal filter circuit having signal filtering characteristics related to the capacitance value of feedback capacitor 916, the resistance value of feedback resistor 912, and the resistance value of input resistor 914, as understood by those of skill in the art.

In this embodiment, first amplifier-filter circuit 910 includes an amplifier circuit having DC signal amplification characteristics related to the resistance value of feedback resistor 912, and the resistance value of input resistor 914, as understood by those of skill in the art.

Second amplifier-filter circuit 920 is configured to receive an input signal from the first amplifier-filter circuit 910 and to generate an output signal based on the received input signal. Second amplifier-filter circuit 920 includes operational amplifier circuit 921, variable feedback resistor 922, feedback capacitor 926, and input resistor 924. Other first amplifier-filter circuits may be used.

The input signal is received from first amplifier-filter circuit 910 at the noninverting input of operational amplifier circuit 921. Input resistor 924 is connected to a ground and to the inverting input of operational amplifier circuit 921. Variable feedback resistor 922 is connected between the inverting input of operational amplifier circuit 921 and the output of operational amplifier circuit 921.

In this embodiment, second amplifier-filter circuit 920 includes a signal filter circuit having signal filtering characteristics related to the capacitance value of feedback capacitor 926, the resistance value of variable feedback resistor 922, and the resistance value of input resistor 924, as understood by those of skill in the art.

In this embodiment, second amplifier-filter circuit 920 includes an amplifier circuit having DC signal amplification characteristics related to the resistance value of variable feedback resistor 922, and the resistance value of input resistor 924, as understood by those of skill in the art.

In this embodiment, the resistance value of variable feedback resistor 922 is programmable, and may be controlled, for example by an input from a controller, such as MCU 170. Accordingly, the DC signal amplification characteristics and the signal filtering characteristics of second amplifier-filter circuit 920 may be controlled by an input from, for example, the controller.

Active feedback circuit 930 is configured to provide an additional feedback path in the closed loop configuration of second amplifier-filter circuit 920. Active feedback circuit 930 includes operational amplifier circuit 931, feedback capacitor 932, input resistor 934, input capacitor 935, input resistor 936, and output resistor 938.

In this embodiment, active feedback circuit 930 operational amplifier circuit 931 is in a closed loop circuit configuration and configured to receive the output signal from second amplifier-filter circuit 920 through a filter formed by input resistor 934 and input capacitor 935. The output of the filter is connected to the noninverting input of operational amplifier circuit 931, such that the noninverting input of operational amplifier circuit 931 receives a filtered version of the output signal from second amplifier-filter circuit 920, where the filtering characteristics are determined by the resistance value of input resistor 934 and the capacitance value of input capacitor 935, as understood by those of skill in the art.

Active feedback circuit 930 causes variations from ground at the noninverting input of operational amplifier circuit 931, as filtered by the feedback capacitor 932 and input resistor 936, to be integrated across feedback capacitor 932, such that the output of operational amplifier circuit 931 corresponds with the integrated and filtered variations.

Output resistor 938 causes the output voltage of operational amplifier circuit 931 to be summed with the feedback voltage generated by variable feedback resistor 922, feedback capacitor 926, and input resistor 924 at the inverting input of operational amplifier circuit 921, as understood by those of skill in the art.

Anti-drift circuit 900 operates according to principles understood by those of skill in the art based on the circuit diagram representation of FIG. 9.

As discussed in further detail above, because of the amplification and the filtering of the disclosed temperature monitor systems, the digital signals generated by the temperature monitor systems are an accurate representation of the value of the temperature sensed by the temperature monitor systems. In some embodiments, the accuracy of the digital signal is greater than about 0.1 C, about 0.05 C, about 0.02 C, about 0.01 C, about 0.005 C, about 0.002 C, about 0.001 C, about 0.0005 C, about 0.0002 C, and about 0.0001 C.

Figure 10:
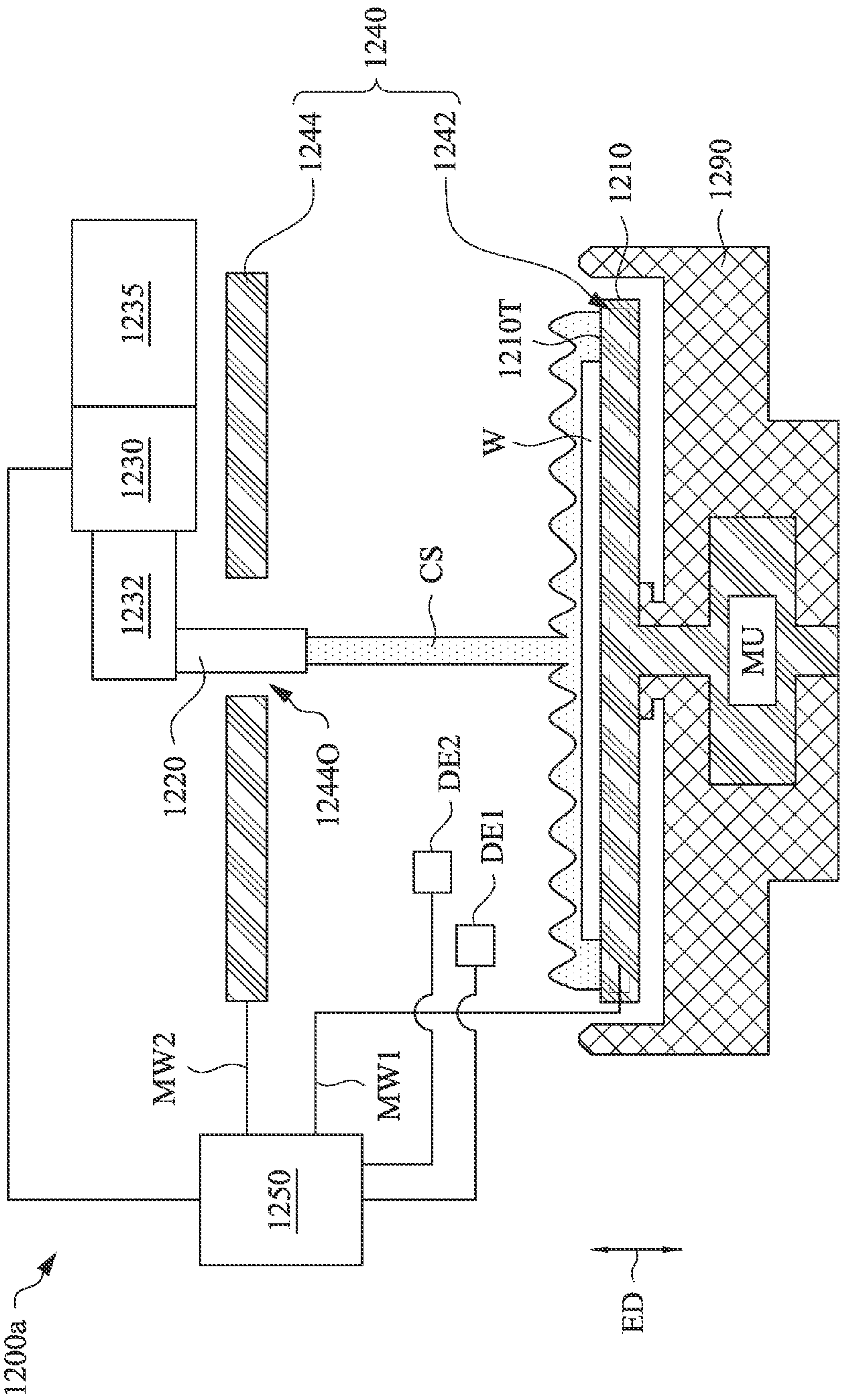
FIG. 10 illustrates a schematic cross-sectional view of a wet etch apparatus according to some embodiments.

FIG. 10 illustrates a schematic cross-sectional view of a wet etch apparatus 1200*a* according to some embodiments of the present disclosure. The wet etch apparatus 1200*a* which uses a temperature control system 1235 according to some embodiments. The wet etch apparatus 1200*a* includes a wafer chuck 1210, a dispensing nozzle 1220, a liquid etchant container 1230, a temperature control system 1235, an electric field generator 1240, and a controller 1250.

The liquid etchant container 1230 contains a chemical solution CS including a liquid etchant and a solvent. Moreover, the chemical solution CS can be pumped from the liquid etchant container 1230 to the dispensing nozzle 1220 through a manifold 1232 in fluid communication with the liquid etchant container 1230 and the dispensing nozzle 1220. The dispensing nozzle 1220 dispenses the chemical solution CS onto the wafer W. The introduction of the chemical solution CS through one dispensing nozzle 1220 is intended to be illustrative only and is not intended to be limited to the embodiments. Any number of separate and independent dispensing nozzle 1220 or other openings to introduce the chemical solution CS may alternatively be utilized. Although a single liquid etchant container 1230 is illustrated in FIG. 10, in some embodiments, plural liquid etchant containers 1230 may be used in order to provide any number and type of etchants desired for the manufacturing process.

The temperature control system 1235 is an embodiment of temperature control system 100, discussed above, and is configured to monitor and control or monitor and adjust the temperature of the chemical solution CS in the liquid etchant container 1230. In some embodiments, the temperature control system 1235 is configured to monitor and control or monitor and adjust the temperature of the chemical solution CS on the wafer W.

The wafer W may be placed on the wafer chuck 1210 in order to position and control the wafer W during the etching process. The wafer chuck 1210 may hold the wafer W using a vacuum suction force, and may optionally include heating mechanisms (not shown) in order to heat the wafer W during the etching process. The wafer chuck 1210 may be connected to a motor MU to rotate the wafer chuck 1210 about its axis, so that the wafer W spins when the motor MU is turned on. The wafer chuck 1210 may be surrounded by a shell 1290 for collected excess chemical solution CS, in which the shell 1290 may have a drain opening where the chemical solution CS may exit. In some embodiments, the surface layer of the wafer chuck 1210 is made of material that is chemically inert to the etchant in the chemical solution CS. As such, a surface layer of the wafer chuck 1210 can withstand the chemistries involved in the etching process. In some embodiments, the surface layer of the wafer chuck 1210 may include steel, stainless steel, nickel, aluminum, alloys of these, combinations of these, and like. Furthermore, although a single wafer chuck 1210 is illustrated in FIG. 10, in some other embodiments, multiple wafer chucks 1210 may be involved in the wet etch apparatus in order to etch multiple wafers W during a single wet etching process.

The electric field generator 1240 includes a first electrode 1242 and a second electrode 1244 spaced apart from the first electrode 1242 in a vertical direction that is perpendicular to a top surface 1210T of the wafer chuck 1210. The first and second electrodes 1242 and 1244 may be applied with different voltages, and the voltage difference can thus result in an electric field across the wafer W. For example, the voltage applied on the first electrode 1242 may be higher than that on the second electrode 1244, and vice versa. Negative ions NI, positive ions PI and polar molecules in the chemical solution CS move in response to the electric field, thereby enhancing the diffusion of the chemical solution CS in certain direction, which in turn will enhance etching (e.g., increasing the etching rate) in the direction. In the present embodiments, the first and second electrodes 1242 and 1244 are arranged in a vertical direction to generate an electric field that is substantially perpendicular to the top surface 1210T of the wafer chuck 1210, thereby enhancing vertical etching.

In the present embodiments, the first electrode 1242 may be integral with (e.g., embedded in) the wafer chuck 1210. In some other embodiments, the first electrode 1242 is not integral with the wafer chuck 1210. For example, in some other embodiments, the wafer chuck 1210 may be arranged between the first electrode 1242 and the second electrode 1244. In some other embodiments, the first electrode 1242 is disposed over the wafer chuck 1210, and the wafer W is placed over the first electrode 1242. In such embodiments, a backside of the wafer W may be in contact with the first electrode 424 during the wet etching process.

In some embodiments, the second electrode 1244 is above the wafer chuck 1210, and has an opening 1244O dimensioned to allow the dispensing nozzle 1220 to dispense the chemical solution CS through the second electrode 1244. In the depicted embodiments, the dispensing nozzle 1220 extends through the opening 1244O of the second electrode 1244, so as to prevent the chemical solution CS from splashing on the second electrode 1244. In some other embodiments, the dispensing nozzle 1220 is above the opening 1244O of the second electrode 1244, so that the chemical solution CS is dispensed through the opening 1244O of the second electrode 1244. The controller 1250 is electrically connected to the first and second electrode 1242 and 1244 through respective metal wires MW1 and MW2 for applying different voltages onto the respective first and second electrodes 1242 and 1244. The controller 1250 may also be electrically connected to a pump in the liquid etchant container 1230, so as to pump the chemical solution CS to the dispensing nozzle 1220.

In some embodiments, the wet etch apparatus 1200*a* includes a chemical solution concentration detector DE1 for detecting a concentration of the chemical solution CS and a light detector DE2 (e.g., a CCD detector) for detecting reflection intensity distribution of reflection light beams from the entire wafer during and/or after the wet etching process. The detected reflection intensity distribution is used to estimate topography of the entire wafer during and/or after the wet etching process, which in turn can be used to inspect an etching result of the wet etching process. The controller 1250 may receive the detected concentration data and the detected reflection intensity distribution data from the detectors (e.g., the detectors DE1 and DE2), analyze the detected concentration data and the detected reflection intensity distribution data, and send signals to the electric field generator 1240 for changing the direction and/or the amplitude of the electric field used on the next wafer based on the analysis result, if the analysis result is unsatisfactory. On the other hand, if the analysis result is satisfactory, the direction and/or the amplitude of the electric field used on the next wafer may remain the same as that used on the current wafer. Example of changing the direction and/or the amplitude of the electric field includes changing the voltages applied to the first and second electrodes 1242 and 1244.

In some embodiments, after performing the wet etching process on a first wafer (referred to wafer W1), the etch result of the first wafer W1 can be detected and analyzed. Thereafter, the first wafer W1 is unloaded from the wet etch apparatus 1200*a* using, for example, a robot arm (not shown). Afterwards, when a second wafer (referred to as wafer W2) is loaded into the wet etch apparatus 1200*a*, the electric field generator 1240 generates a different electric field than that used in etching the previous wafer W1. In greater detail, the electric field used in the present wafer W2 is controlled based on the analyzed etch result of the previous wafer W1. In this way, the etch result of the wafer W2 can be improved as compared to the previous wafer W1. In some other embodiments, the electric field can be tuned in a real time manner according to the analysis result during etching the target wafer. In some other embodiments, the wet etch apparatus 1200*a* may further include includes other types of detectors, and the controller 1250 may change the direction and/or the amplitude of the electric field based on the analysis result analyzed from detected results of the other types of detectors.

Figure 11:
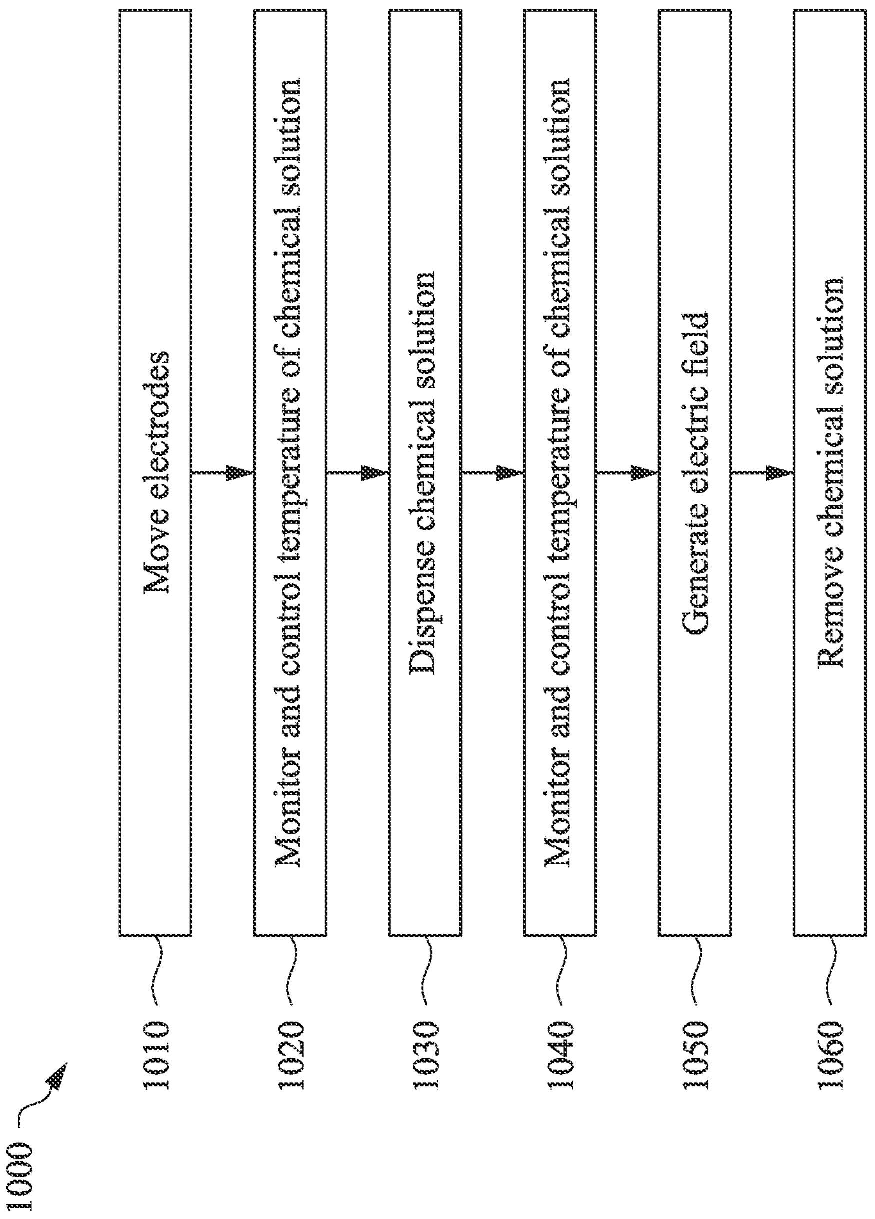
FIG. 11 illustrates a flow chart of a wet etching method according to some embodiments.

FIG. 11 is a flow chart of a wet etching method 1000 according to some embodiments. The method 1000 includes 1010, 1030, 1050, 1060, and either or both of 1020 and 1040. The illustration is merely exemplary and is not intended to limit beyond what is specifically recited in the claims that follow. It is understood that additional operations may be provided before, during, and after the operations illustrated in FIG. 11, and some of the operations described below can be replaced or eliminated for additional embodiments of the method. The order of the operations/processes may be interchangeable.

Reference is made to FIG. 11. At 1010, the electrodes or probes are moved to desired positions. For example, the controller 1250 may control the movement of the electrodes or probes. The desired positions may be predetermined in advance based on a desired etch direction. For example, the first and second electrodes 1242 and 1244 may be moved to target positions that are spaced apart horizontally, which in turn will result in improved lateral etching rate. In some embodiments, the first and second electrodes 1242 and 1244 may be moved to target positions that are spaced apart vertically, which in turn will result in improved vertical etching rate. In some embodiments where the electrodes are already in desired positions, the 1010 can be omitted.

At 1020, the temperature control system 1235 monitors and controls or monitors and adjusts the temperature of the chemical solution CS in the liquid etchant container 1230. In some embodiments, the temperature control system 1235 monitors and controls or monitors and adjusts the temperature of the chemical solution CS using structures and capabilities similar or identical to the structures and capabilities of the structures discussed above with reference to the various embodiments of temperature control system 100. In some embodiments, 1020 can be omitted.

At 1030, the controller 1250 may control a pump in the liquid etchant container 1230 to pump the chemical solution CS to the dispensing nozzle 1220, so that the dispensing nozzle 1220 dispenses the chemical solution CS onto the wafer W.

At 1040, the temperature control system 1235 monitors and controls or monitors and adjusts the temperature of the chemical solution CS on the wafer W. In some embodiments, the temperature control system 1235 monitors and controls or monitors and adjusts the temperature of the chemical solution CS using structures and capabilities similar or identical to the structures and capabilities of the structures discussed above with reference to the various embodiments of temperature control system 100. In some embodiments, 1040 can be omitted.

At 1050, an electric field is generated across the wafer W for enhancing the diffusion of the chemical solution CS in one or more desired etching directions, such that the target structures (e.g., fins of a finFET in a fin recessing process or polysilicon gate electrodes in the dummy gate removal process) may be etched by the liquid etchant in the chemical solution CS in one or more the desired etching directions. For example, the controller 1250 may apply voltage difference between the first and second electrodes 1242 and 1244 or between the probe 1248 and the first electrode 1242. In some embodiments, the electrodes or the probe may remain stationary during the etching process, so that the direction of the electric field is kept in the same direction during the etching process. In some other embodiments, the electrodes or the probe may be moved during the etching process, such that the direction of the electric field changes during the etching process. In the depicted flow chart as shown in FIG. 11, the electric field is generated after dispensing the chemical solution CS onto the wafer W. In some other embodiments, the electric field is generated before dispensing the chemical solution CS onto the wafer W. In some embodiments, the electric field is generated during dispensing the chemical solution.

At 1060, the chemical solution CS is removed from the wafer W, for example, by a cleaning process. In the cleaning process, a cleaning agent may be applied on to the wafer W for removing the chemical solution CS from the wafer W. In some embodiments, the electric field generator 1240 may generate the electric field during the cleaning process. The electric field may induce the cleaning agent (e.g., de-ionized water) to diffuse in one or more desired directions and reducing or increasing the surface tension of the cleaning agent, thereby control the directionality of cleaning. In these embodiments, the electric field generator 1240 may keep generating the electric field from the etching process to the cleaning process. In some other embodiments, the cleaning process may be performed without the electric field. Stated differently, the electric field can be turned off before applying the cleaning agent. After the applying the cleaning agent, a dry process may be performed.

One inventive aspect is a temperature control system, including a temperature monitor system. The temperature monitor system includes an anti-drift system having first and second amplification stages and first and second filter stages. At least one of the first amplification stage, the second amplification stage, the first filter stage, and the second filter stage has an active feedback circuit.

In some embodiments, the temperature control system also includes a temperature sensor signal generator configured to sense a temperature and to generate a temperature sensor signal corresponding with the sensed temperature, where the anti-drift system is configured to generate an output signal based at least partly on the temperature sensor signal.

In some embodiments, the temperature control system also includes an analog to digital converter (ADC) configured to generate a digital signal representing the sensed temperature at least partly based on the output signal of the anti-drift system.

In some embodiments, the temperature control system also includes a microcontroller unit (MCU) configured to generate a temperature control signal based on the digital signal of the ADC.

In some embodiments, at least two of the first amplification stage, the second amplification stage, the first filter stage, and the second filter stage have an active feedback circuit.

In some embodiments, at least one of the first amplification stage, the second amplification stage, the first filter stage, and the second filter stage is programmable.

In some embodiments, at least two of the first amplification stage, the second amplification stage, the first filter stage, and the second filter stage are programmable.

In some embodiments, the active feedback circuit includes an integrator.

Another inventive aspect is a temperature monitor system. The temperature monitor system includes an anti-drift system having first and second amplification stages and first and second filter stages. At least one of the first amplification stage, the second amplification stage, the first filter stage, and the second filter stage is programmable.

In some embodiments, the temperature monitor system also includes a temperature sensor signal generator configured to sense a temperature and to generate a temperature sensor signal corresponding with the sensed temperature, where the anti-drift system is configured to generate an output signal based at least partly on the temperature sensor signal.

In some embodiments, the temperature monitor system also includes an analog to digital converter (ADC) configured to generate a digital signal representing the sensed temperature at least partly based on the output signal of the anti-drift system.

In some embodiments, the temperature monitor system also includes a microcontroller unit (MCU) configured to generate a temperature control signal based on the digital signal of the ADC.

In some embodiments, at least two of the first amplification stage, the second amplification stage, the first filter stage, and the second filter stage are programmable.

In some embodiments, at least one of the first amplification stage, the second amplification stage, the first filter stage, and the second filter stage has an active feedback circuit.

In some embodiments, at least two of the first amplification stage, the second amplification stage, the first filter stage, and the second filter stage have an active feedback circuit.

In some embodiments, the active feedback circuit includes an integrator.

Another inventive aspect is a method of using a temperature monitor system, the method including with an anti-drift system, receiving a temperature sensor signal representing a temperature, with the anti-drift system, amplifying and filtering the temperature sensor signal to generate an output signal, and, with an analog to digital converter (ADC), generating a digital signal representing the temperature based on the output signal from the anti-drift system.

In some embodiments, the method also includes, with a temperature sensor signal generator, sensing the temperature and generating the temperature sensor signal.

In some embodiments, the method also includes, with a microcontroller unit (MCU), generating a temperature control signal based on the digital signal of the ADC.

In some embodiments, the method also includes, with a microcontroller unit (MCU), programming the anti-drift system.

In the descriptions above and in the claims, phrases such as “at least one of” or “one or more of” may occur followed by a conjunctive list of elements or features. The term “and/or” may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases “at least one of A and B;” “one or more of A and B;” and “A and/or B” are each intended to mean “A alone, B alone, or A and B together.” A similar interpretation is also intended for lists including three or more items. For example, the phrases “at least one of A, B, and C;” “one or more of A, B, and C;” and “A, B, and/or C” are each intended to mean “A alone, B alone, C alone, A and B together, A and C together, B and C together, or A and B and C together.” Use of the term “based on,” above and in the claims is intended to mean, “based at least in part on,” such that an unrecited feature or element is also permissible.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A temperature control system, comprising:

a temperature monitor system configured to generate a temperature signal, wherein the temperature monitor system comprises:

a temperature sensor signal generator configured to output a temperature sensor signal;

an anti-drift system, comprising:

first and second amplification stages, and first and second filter stages; and an analog to digital converter (ADC) configured to generate a digital signal representing the sensed temperature at least partly based on the output signal of the anti-drift system;

wherein at least one of the first amplification stage, the second amplification stage, the first filter stage, and the second filter stage has an active feedback circuit.

2. The temperature control system of claim 1, further comprising a microcontroller unit (MCU) configured to generate a temperature control signal based on the digital signal of the ADC.

3. The temperature control system of claim 1, wherein at least two of the first amplification stage, the second amplification stage, the first filter stage, and the second filter stage have an active feedback circuit.

4. The temperature control system of claim 1, wherein at least one of the first amplification stage, the second amplification stage, the first filter stage, and the second filter stage is programmable.

5. The temperature control system of claim 1, wherein at least two of the first amplification stage, the second amplification stage, the first filter stage, and the second filter stage are programmable.

6. The temperature control system of claim 5, wherein the active feedback circuit comprises an integrator.

7. A temperature control system, comprising:

a temperature monitor system configured to generate a temperature signal, wherein the temperature monitor system comprises a temperature sensor signal generator configured to output a temperature sensor signal, and an anti-drift system coupled to the temperature sensor signal generator, the anti-drift system comprising:

a first amplification stage;

a second amplification stage;

a first filter stage; and a second filter stage configured to filter the temperature sensor signal, wherein at least one of the first amplification stage, the second amplification stage, the first filter stage, and the second filter stage has an active feedback circuit; and a heater configured to:

receive a temperature control signal generated based on the temperature signal; and control a temperature of a physical aspect of a semiconductor manufacturing process according to the temperature control signal.

8. The temperature control system of claim 7, further comprising an analog to digital converter (ADC) configured to generate a digital signal representing the sensed temperature based on at least the output signal of the anti-drift system.

9. The temperature control system of claim 8, further comprising a microcontroller unit (MCU) configured to generate the temperature control signal based on the digital signal of the ADC.

10. The temperature control system of claim 7, wherein at least two of the first amplification stage, the second amplification stage, the first filter stage, and the second filter stage have an active feedback circuit.

11. The temperature control system of claim 7, wherein at least one of the first amplification stage, the second amplification stage, the first filter stage, and the second filter stage is programmable.

12. The temperature control system of claim 1, wherein at least two of the first amplification stage, the second amplification stage, the first filter stage, and the second filter stage are programmable.

13. The temperature control system of claim 12, wherein the active feedback circuit comprises an integrator.

14. The temperature control system of claim 7, wherein the active feedback circuit comprises an operational amplifier in a closed loop circuit configuration.

15. The temperature control system of claim 7, wherein the active feedback circuit comprises an operational amplifier, a feedback capacitor, a first input resistor, a second input capacitor, and an output resistor.

16. The temperature control system of claim 15, wherein the feedback capacitor is connected between an inverting input terminal of the operational amplifier and an output terminal of the operational amplifier.

17. A temperature control system, comprising:

a temperature monitor system configured to generate a temperature signal, wherein the temperature monitor system comprises a temperature sensor signal generator configured to output a temperature sensor signal, and an anti-drift system coupled to the temperature sensor signal generator, the anti-drift system comprising:

a first amplification stage;

a second amplification stage;

a first filter stage; and a second filter stage configured to filter the temperature sensor signal, wherein at least one of the first amplification stage, the second amplification stage, the first filter stage, and the second filter stage has an active feedback circuit;

a microcontroller unit (MCU) coupled to the temperature monitor system and configured to generate a temperature control signal based on the temperature signal; and a heater coupled to the MCU and configured to:

receive the temperature control signal; and control a temperature of a physical aspect of a semiconductor manufacturing process according to the temperature control signal.

18. The temperature control system of claim 1, further comprising a linear power supply configured to supply power to the temperature monitor system.

19. The temperature control system of claim 1, wherein the temperature sensor signal generator comprises a Resistance Temperature Detector (RTD) or a thermocouple.

* * * * *